US012426477B2

(12) United States Patent
Fukuda

(10) Patent No.: US 12,426,477 B2
(45) Date of Patent: Sep. 23, 2025

(54) DISPLAY DEVICE WITH ALUMINUM BILAYER ELECTRODE

(71) Applicant: Magnolia White Corporation, Tokyo (JP)

(72) Inventor: Kaichi Fukuda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 357 days.

(21) Appl. No.: 18/159,091

(22) Filed: Jan. 25, 2023

(65) Prior Publication Data
US 2023/0240118 A1 Jul. 27, 2023

(30) Foreign Application Priority Data

Jan. 27, 2022 (JP) ................................. 2022-011097

(51) Int. Cl.
H10K 59/80 (2023.01)
H10K 71/00 (2023.01)
H10K 102/00 (2023.01)

(52) U.S. Cl.
CPC ......... *H10K 59/8721* (2023.02); *H10K 71/00* (2023.02); *H10K 2102/351* (2023.02)

(58) Field of Classification Search
CPC ............... H10K 59/8721; H10K 71/00; H10K 2102/351; H10K 71/231; H10K 59/352; H10K 59/873; H10K 59/122; H01L 21/3213
See application file for complete search history.

(56) References Cited

U.S. PATENT DOCUMENTS

| 2004/0160170 A1 | 8/2004 | Sato et al. | |
| 2007/0269917 A1* | 11/2007 | Hubert | H10K 59/879 |
| | | | 257/E33.068 |
| 2007/0287207 A1* | 12/2007 | Fujii | H10K 59/122 |
| | | | 438/22 |
| 2009/0009069 A1 | 1/2009 | Takata | |

(Continued)

FOREIGN PATENT DOCUMENTS

| JP | 2000-195677 A | 7/2000 |
| JP | 2004-207217 A | 7/2004 |

(Continued)

OTHER PUBLICATIONS

Kugimiya et al., "Development of a Dry-etch Technology in Al-alloy Films for Liquid Crystal Displays", Kobe Steel Engineering Reports, vol. 52, No. 2, Sep. 2002, pp. 6-11 (6 pages including English Abstract).

(Continued)

*Primary Examiner* — Joe E. Schoenholtz
(74) *Attorney, Agent, or Firm* — XSENSUS LLP

(57) ABSTRACT

According to one embodiment, a display device comprises a lower electrode, a rib, a partition, an upper electrode, an organic layer between the lower electrode and the upper electrode, and a sealing layer above the upper electrode. The partition includes a lower portion on the rib, and an upper portion on the lower portion with an end portion protruding from a side surface of the lower portion. The lower portion includes a first aluminum layer of a first aluminum alloy, and a second aluminum layer of pure aluminum or a second aluminum alloy different from the first aluminum alloy and which is arranged on the first aluminum layer.

15 Claims, 10 Drawing Sheets

(56) References Cited

U.S. PATENT DOCUMENTS

| | | | |
|---|---|---|---|
| 2011/0133666 A1 | 6/2011 | Arai | |
| 2018/0130972 A1 | 5/2018 | Sonoda et al. | |
| 2019/0363275 A1 | 11/2019 | Ochi et al. | |
| 2022/0069254 A1* | 3/2022 | Liu | H10K 59/80522 |
| 2023/0240117 A1* | 7/2023 | Fukuda | H10K 59/8721 257/40 |

FOREIGN PATENT DOCUMENTS

| | | |
|---|---|---|
| JP | 2008-135325 A | 6/2008 |
| JP | 2009-32673 A | 2/2009 |
| JP | 2010-118191 A | 5/2010 |
| WO | 2018/179308 A1 | 10/2018 |

OTHER PUBLICATIONS

Indian Office Action issued Jun. 11, 2024, in corresponding Indian Patent Application No. 202314004769, 6pp.

* cited by examiner

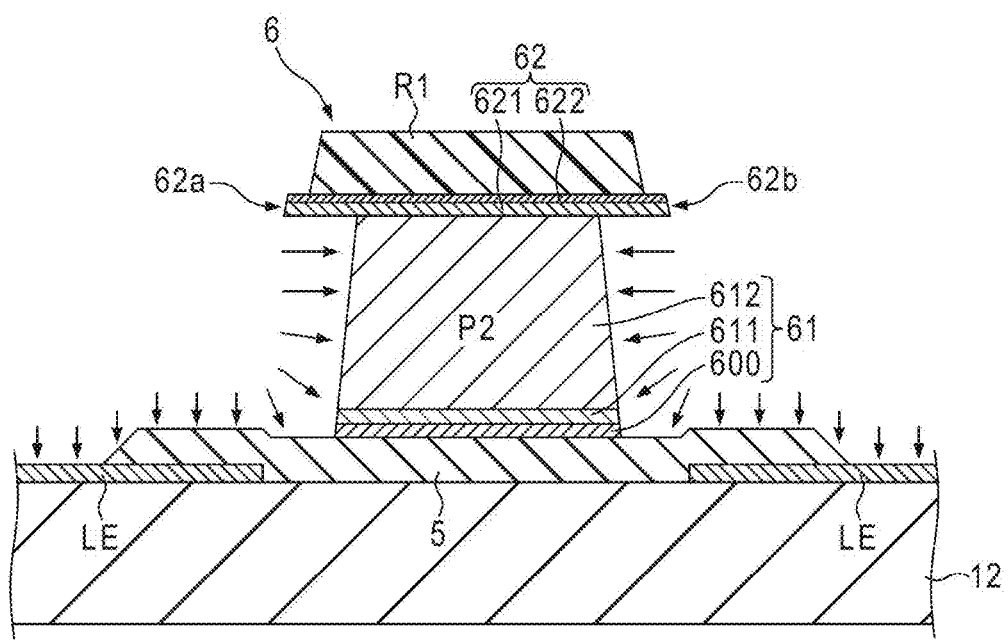
F I G. 10

DISPLAY DEVICE WITH ALUMINUM BILAYER ELECTRODE

CROSS-REFERENCE TO RELATED APPLICATIONS

This application is based upon and claims the benefit of priority from Japanese Patent Application No. 2022-011097, filed Jan. 27, 2022, the entire contents of which are incorporated herein by reference.

FIELD

Embodiments described herein relate generally to a display device and a manufacturing method of the same.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

A technique of suppressing reduction in reliability is required in processes of manufacturing the above display device.

BRIEF DESCRIPTION OF THE DRAWINGS

FIG. 10 is a schematic cross-sectional view showing a manufacturing process following FIG. 9.

DETAILED DESCRIPTION

Figure 1:
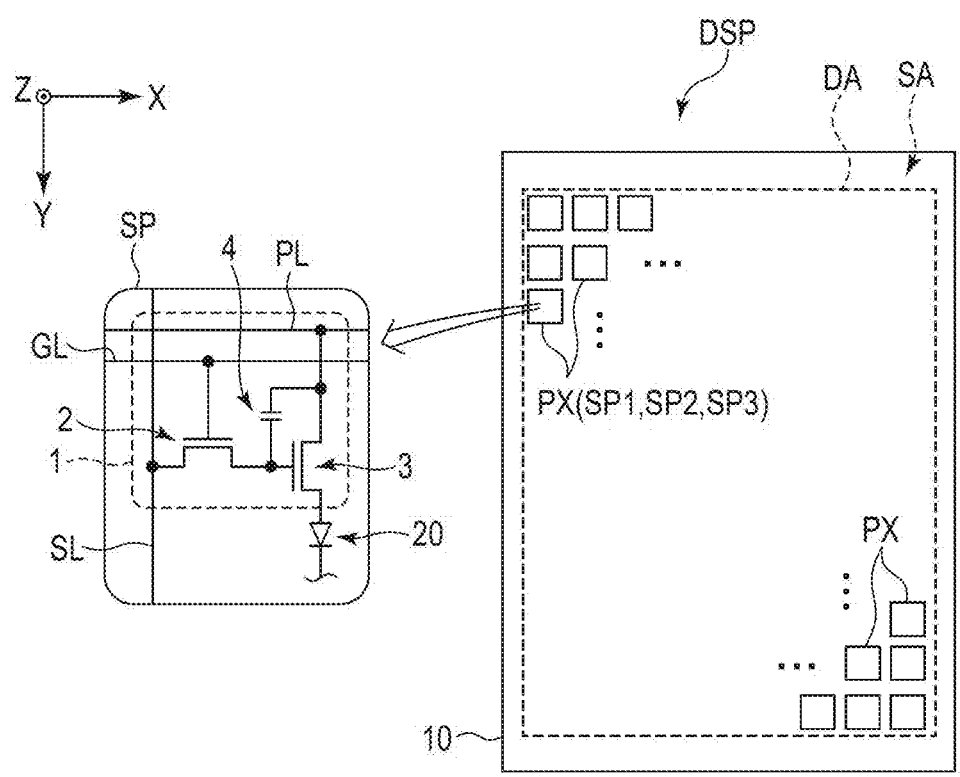
FIG. 1 is a view showing a configuration example of a display device according to one of embodiments.

In general, according to one embodiment, a display device comprises a lower electrode; a rib which covers a part of the lower electrode and which includes an aperture overlaps with the lower electrode; a partition arranged on the rib; an upper electrode which is opposed to the lower electrode and is in contact with the partition; an organic layer located between the lower electrode and the upper electrode to emit light in accordance with a potential difference between the lower electrode and the upper electrode; and a sealing layer located above the upper electrode. The partition includes a lower portion arranged on the rib, and an upper portion arranged on the lower portion with an end portion protruding from a side surface of the lower portion. The lower portion includes a first aluminum layer formed of a first aluminum alloy, and a second aluminum layer which is formed of pure aluminum or a second aluminum alloy different from the first aluminum alloy and which is arranged on the first aluminum layer.

According to another aspect of the embodiment, a manufacturing method is to manufacturing a display device in which a partition including a lower portion and an upper portion arranged on the lower portion with an end portion protruding from a side surface of the lower portion is arranged on a boundary between adjacent sub-pixels, and the method comprises forming a first aluminum layer of a first aluminum alloy; forming a second aluminum layer of pure aluminum or a second aluminum alloy different from the first aluminum alloy, on the first aluminum layer; forming the upper portion on the second aluminum layer; removing a portion of the second aluminum layer, which is exposed from the upper portion, by anisotropic etching; and reducing a width of the second aluminum layer located under the upper portion and removing a portion of the first aluminum layer, which is exposed from the second aluminum layer, by isotropic etching, and thereby forming the lower portion.

According to these configurations, reliability in the display device can be increased.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as planar view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP according to the embodiments. The display device DSP has a display area DA where images are displayed and a surrounding area SA around the display area DA, on an insulating substrate 10. The substrate 10 may be glass or a flexible resin film.

In the embodiment, the shape of the substrate 10 in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. For example, the pixel PX includes a red sub-pixel SP1, a green sub-pixel SP2, and a blue sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element 20.

The configuration of the pixel circuit 1 is not limited to the example shown in the figure. For example, the pixel circuit 1 may comprise more thin-film transistors and capacitors.

The display element 20 is an organic light-emitting diode (OLED) serving as a light emitting element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

Figure 2:
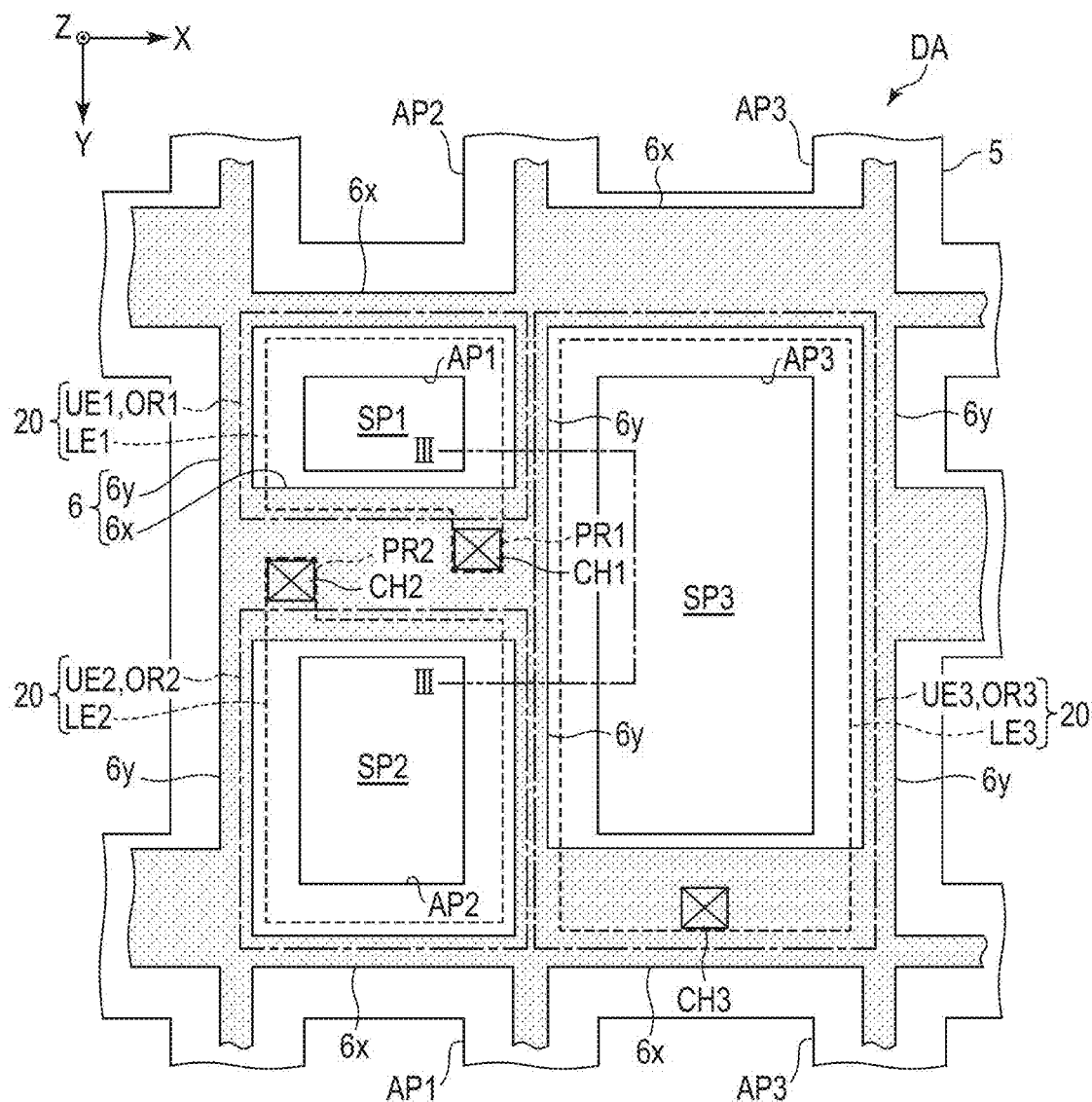
FIG. 2 is a view showing an example of a layout of sub-pixels.

FIG. 2 is a view showing an example of a layout of the sub-pixels SP1, SP2, and SP3. In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a row in which the sub-pixels SP1 and SP2 are alternately arranged in the second direction Y and a row in which a plurality of sub-pixels SP3 are repeatedly arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 is arranged at a boundary of adjacent sub-pixels SP and overlaps with the rib 5 in planar view. The partition 6 includes a plurality of first partitions 6x extending in the first direction X and a plurality of second partitions 6y extending in the second direction Y. The plurality of first partitions 6x are located between the apertures AP1 and AP2 adjacent in the second direction Y and between two apertures AP3 adjacent in the second direction Y. The second partitions 6y are located between the apertures AP1 and AP3 adjacent in the first direction X and between the apertures AP2 and AP3 adjacent in the first direction X.

In the example in FIG. 2, the first partitions 6x and the second partitions 6y are connected to each other. Thus, the partition 6 has a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3. In the example shown in FIG. 2, outer shapes of the upper electrode UE1 and the organic layer OR1 correspond to each other, outer shapes of the upper electrode UE2 and the organic layer OR2 correspond to each other, and outer shapes of the upper electrode UE3 and the organic layer OR3 correspond to each other.

The lower electrode LE1, the upper electrode UE1, and the organic layer OR1 constitute the display element 20 of the sub-pixel SP1. The lower electrode LE2, the upper electrode UE2, and the organic layer OR 2 constitute the display element 20 of the sub-pixel SP2. The lower electrode LE3, the upper electrode UE3, and the organic layer OR3 constitute the display element 20 of the sub-pixel SP3.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

In the example of FIG. 2, the contact holes CH1 and CH2 entirely overlap with the first partition 6x between the apertures AP1 and AP2 adjacent in the second direction Y. The contact hole CH3 entirely overlaps with the first partition 6x between two apertures AP3 adjacent in the second direction Y. As the other example, at least parts of the contact holes CH1, CH2, and CH3 may not overlap with the first partition 6x.

In the example in FIG. 2, the lower electrodes LE1 and LE2 include protrusions PR1 and PR2, respectively. The protrusion PR1 protrudes from a main body of the lower electrode LE1 (portion overlapping with the aperture AP1) toward the contact hole CH1. The protrusion PR2 protrudes from a main body of the lower electrode LE2 (portion overlapping with the aperture AP2) toward the contact hole CH2. The contact holes CH1 and CH2 overlap with the protrusions PR1 and PR2, respectively.

Figure 3:
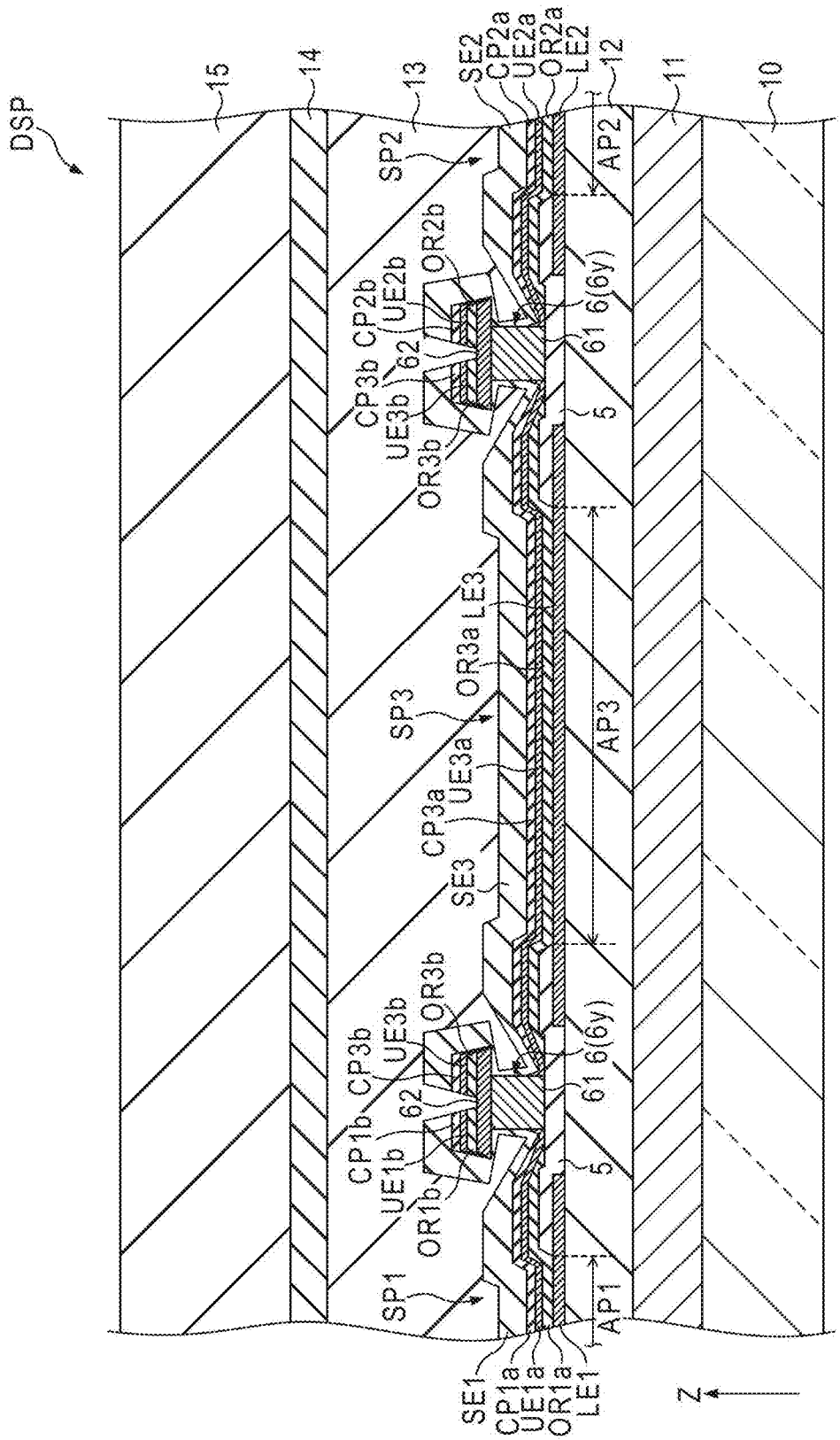
FIG. 3 is a schematic cross-sectional view showing the display device taken along line III-III in FIG. 2.

FIG. 3 is a schematic cross-sectional view showing the display device DSP taken along line III-III in FIG. 2. A circuit layer 11 is arranged on the substrate 10 described above. The circuit layer 11 includes various circuits and lines such as the pixel circuits 1, the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11. Although not shown in the cross section of FIG. 3, the contact holes CH1, CH2, and CH3 are provided in the insulating layer 12.

The lower electrodes LE1, LE2, and LE3 are arranged on the insulating layer 12. The rib 5 is arranged on the insulating layer 12 and the lower electrodes LE1, LE 2, and LE3. End parts of the lower electrodes LE1, LE2, and LE3 are covered with the rib 5.

The partition 6 includes a lower portion 61 arranged on the rib 5 and an upper portion 62 that covers an upper surface of the lower portion 61. The upper portion 62 has a width greater than the lower portion 61. As a result, both the end parts of the upper 62 protrude beyond the side surfaces of the lower portion 61 in FIG. 3. This shape of the partition 6 is referred to as overhanging.

The organic layer OR1 shown in FIG. 2 includes a first organic layer OR1a and a second organic layer OR1b that are separated from each other. In addition, the upper electrode UE1 shown in FIG. 2 includes a first upper electrode UE1a and a second upper electrode UE1b that are separated from each other. As shown in FIG. 3, the first organic layer OR1a is brought into contact with the lower electrode LE1 through the aperture AP1 and covers a part of rib 5. The second organic layer OR1b is located on the upper portion 62. The first upper electrode UE1a is opposed to the lower electrode LE1 and covers the first organic layer OR1a. Furthermore, the first upper electrode UE1a is in contact with the side surface of the lower portion 61. The second upper electrode UE1b is located on this partition 6 and covers the second organic layer OR1b.

The organic layer OR2 shown in FIG. 2 includes a first organic layer OR2a and a second organic layer OR2b that are separated from each other. In addition, the upper electrode UE2 shown in FIG. 2 includes a first upper electrode UE2a and a second upper electrode UE2b that are separated from each other. As shown in FIG. 3, the first organic layer OR2a is brought into contact with the lower electrode LE2 through the aperture AP2 and covers a part of the rib 5. The second organic layer OR2b is located on the upper portion 62. The first upper electrode UE2a is opposed to the lower electrode LE2 and covers the first organic layer OR2a. Furthermore, the first upper electrode UE2a is in contact with the side surface of the lower portion 61. The second upper electrode UE2b is located above the partition 6 and covers the second organic layer OR2b.

The organic layer OR3 shown in FIG. 2 includes a first organic layer OR3a and the second organic layer OR3b that are separated from each other. In addition, the upper electrode UE3 shown in FIG. 2 includes a first upper electrode UE3a and a second upper electrode UE3b that are separated from each other. As shown in FIG. 3, the first organic layer OR3a is brought into contact with the lower electrode LE3 through the aperture AP3 and covers a part of the rib 5. The second organic layer OR3b is located on the upper portion 62. The first upper electrode UE3a is opposed to the lower electrode LE3 and covers the first organic layer OR3a. Furthermore, the first upper electrode UE3a is in contact with the side surface of the lower portion 61. The second upper electrode UE3b is located above the partition 6 and covers the second organic layer OR3b.

In the example of FIG. 3, the sub-pixels SP1, SP2, and SP3 include cap layers CP1, CP2, and CP3 for adjusting the optical characteristics of the light emitted from the emitting layers of the organic layers OR1, OR2, and OR3.

The cap layer CP1 includes a first cap layer CP1a and a second cap layer CP1b that are separated from each other. The first cap layer CP1a is located at the aperture AP1 and arranged on the first upper electrode UE1a. The second cap layer CP1b is located above the partition 6 and arranged on the second upper electrode UE1b.

The cap layer CP2 includes a first cap layer CP2a and a second cap layer CP2b that are separated from each other. The first cap layer CP2a is located at the aperture AP2 and arranged on the first upper electrode UE2a. The second cap layer CP2b is located above the partition 6 and arranged on the second upper electrode UE2b.

The cap layer CP3 includes a first cap layer CP3a and a second cap layer CP3b that are separated from each other. The first cap layer CP3a is located at the aperture AP3 and arranged on the first upper electrode UE3a. The second cap layer CP3b is located above the partition 6 and arranged on the second upper electrode UE3b.

Sealing layers SE1, SE2, and SE3 are arranged in the sub-pixels SP1, SP2, and SP3, respectively. The sealing layer SE1 continuously covers members of the sub-pixel SP1 including the first cap layer CP1a, the partition 6, and the second cap layer CP1b. The sealing layer SE2 continuously covers members of the sub-pixel SP2 including the first cap layer CP2a, the partition 6, and the second cap layer CP2b. The sealing layer SE3 continuously covers members of the sub-pixel SP3 including the first cap layer CP3a, the partition 6, and the second cap layer CP3b.

In the example in FIG. 3, the second organic layer OR1b, the second upper electrode UE1b, the second cap layer CP1b, and the sealing layer SE1 on the partition 6 between the sub-pixels SP1 and SP3 are separated from the second organic layer OR3b, the second upper electrode UE3b, the second cap layer CP3b, and the sealing layer SE3 on the partition 6. In addition, the second organic layer OR2b, the second upper electrode UE2b, the second cap layer CP2b, and the sealing layer SE2 on the partition 6 between the sub-pixels SP2 and SP3 are separated from the second organic layer OR3b, the second upper electrode UE3b, the second cap layer CP3b, and the sealing layer SE3 on the partition 6.

The sealing layers SE1, SE2, and SE3 are covered with a resin layer 13. The resin layer 13 is covered with a sealing layer 14. Furthermore, the sealing layer 14 is covered with a resin layer 15.

The insulating layer 12 and the resin layers 13 and 15 are formed of an organic material. The rib 5 and the sealing layers 14, SE1, SE2, and SE3 are formed of, for example, an inorganic material such as silicon nitride (SiNx).

The lower portion 61 of the partition 6 is conductive. The upper portion 62 of the partition 6 may also be conductive. The lower electrodes LE1, LE2, and LE3 may be formed of a transparent conductive oxide such as indium tin oxide (ITO) or may have a multilayer structure of a metallic material such as silver (Ag) and a conductive oxide. The upper electrodes UE1, UE2, and UE3 are formed of, for example, a metallic material such as an alloy (MgAg) of magnesium and silver. The upper electrodes UE1, UE2, and UE3 may be formed of a conductive oxide.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include a pair of functional layers and a light emitting layer interposed between these functional layers. As an example, each of the organic layers OR1, OR2, and OR3 includes a structure in which a hole-injection layer, a hole-transport layer, an electron blocking layer, an emitting layer, a hole blocking layer, an electron-transport layer, and an electron-injection layer are stacked in this order.

The cap layers CP1, CP2, and CP3 are formed of, for example, multilayer bodies of a plurality of transparent thin films. The multilayer body may include a thin film formed of an inorganic material and a thin film formed of an organic material, as the plurality of thin films. In addition, the plurality of thin films have refractive indexes different from one another. The materials of the thin films constituting the multilayer body are different from the materials of the upper electrodes UE1, UE2, and UE3 and different from the materials of the sealing layers SE1, SE2, and SE3. The cap layers CP1, CP2, and CP3 may be omitted.

A common voltage is supplied to the partition 6. This common voltage is supplied to each of the first upper electrodes UE1a, UE2a, and UE3a that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the emitting layer of the first organic layer OR1a emits light of the red wavelength range. When a potential difference is formed between the lower electrode LE2 and the upper electrode UE2, the emitting layer of the first organic layer OR2a emits light of the green wavelength range. When a potential difference is formed between the lower electrode LE3 and the upper electrode UE3, the emitting layer of the first organic layer OR3a emits light of the blue wavelength range.

As another example, the emitting layers of the organic layers OR1, OR2, and OR3 may emit light of the same color (for example, white). In this case, the display device DSP may comprise color filters that convert the light emitted from the emitting layers into light of the colors corresponding to the sub-pixels SP1, SP2, and SP3. In addition, the display device DSP may comprise color filters that are excited by the light emitted from the emitting layers and generate the light of the colors corresponding to the sub-pixels SP1, SP2, and SP3.

Figure 4:
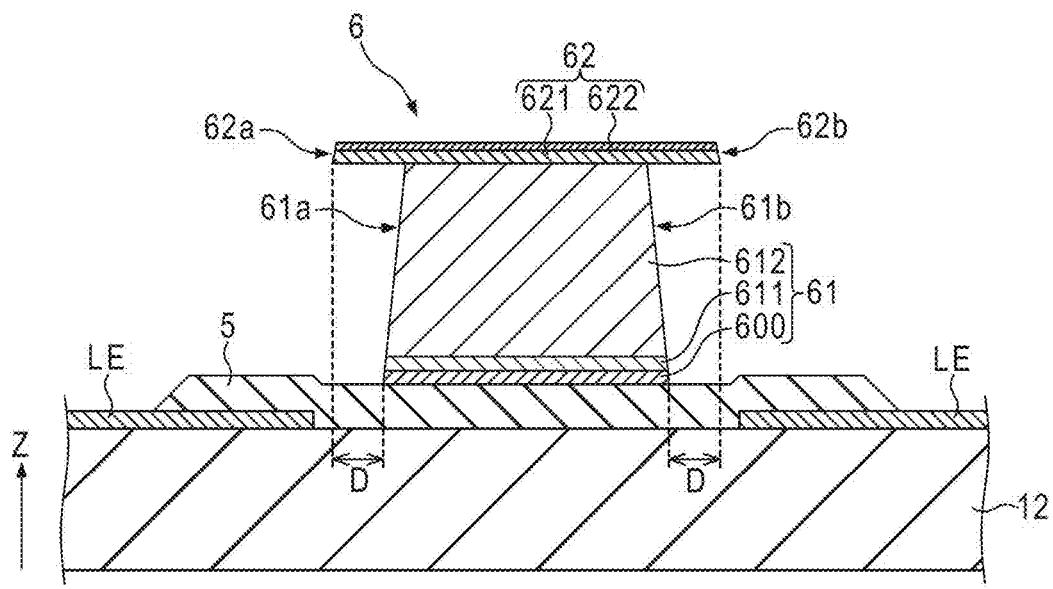
FIG. 4 is a schematic cross-sectional view showing a partition.

FIG. 4 is a schematic, enlarged cross-sectional view showing the partition 6. In this figure, elements other than the rib 5, the partition 6, the insulating layer 12, and a pair of lower electrodes LE are omitted. The pair of lower electrodes LE correspond to any of the above-described lower electrodes LE1, LE2, and LE3. The first partition 6x and the second partition 6y described above have the same structure as the partition 6 shown in FIG. 4.

In the example of FIG. 4, the lower portion 61 of the partition 6 includes a barrier layer 600 arranged on the rib 5, a first aluminum layer 611 arranged on the barrier layer 600, and a second aluminum layer 612 arranged on the first aluminum layer 611. The second aluminum layer 612 is formed to be thicker than the barrier layer 600 and the first aluminum layer 611.

The upper portion 62 is thinner than the lower portion 61. In the example of FIG. 4, the upper portion 62 includes a first layer 621 arranged on the second aluminum layer 612 and a second layer 622 covering the first layer 621.

In the example of FIG. 4, the width of the lower portion 61 becomes smaller toward the upper portion 62. In other words, side surfaces 61a and 61b of the lower portion 61 are inclined to the third direction Z. The upper portion 62 includes an end portion 62a protruding from the side surface 61a and an end portion 62b protruding from the side surface 61b.

An amount of protrusion D of the end portions 62a and 62b from the side surfaces 61a and 61b is, for example, 2.0 μm or less and is smaller than the thickness of the lower portion 61. The amount of protrusion D corresponds to a distance from lower ends of the side surfaces 61a and 61b to the end portions 62a and 62b in the width direction (first direction X or second direction Y) of the partition 6.

The barrier layer 600 is formed of, for example, molybdenum (Mo), molybdenum tungsten alloy (MoW) or copper (Cu). The first layer 621 is formed of, for example, titanium (Ti). The second layer 622 is formed of, for example, a conductive oxide such as ITO, IZO or IGZO, or a silicon oxide (SiO).

The partition 6 may not include the barrier layer 600. In addition, the upper portion 62 may have a single-layer structure. Such an upper portion 62 having the single-layer structure can be formed of, for example, titanium.

The first aluminum layer 611 is formed of a first aluminum alloy. The second aluminum layer 612 is formed of pure aluminum (Al) or a second aluminum alloy different from the first aluminum alloy. For example, an aluminum-neodymium alloy (AlNd) or an aluminum-yttrium alloy (AlY) can be used as the first aluminum alloy. For example, an aluminum-silicon alloy (AlSi) can be used as the second aluminum alloy.

The thickness of the first aluminum layer 611 is desirably 0.01 μm or more and 30% or less of the total thickness of the first aluminum layer 611 and the second aluminum layer 612. In one example, the first aluminum layer 611 is formed to have a thickness of 0.05 μm by the aluminum-neodymium alloy, and the second aluminum layer 612 is formed to have a thickness of 0.85 μm by the pure aluminum. In addition, the barrier layer 600 is formed to have a thickness of 0.05 μm by molybdenum, the first layer 621 is formed to have a thickness of 0.10 μm by titanium, and the second layer 622 is formed to have a thickness of 0.05 μm by the ITO.

Figure 5:
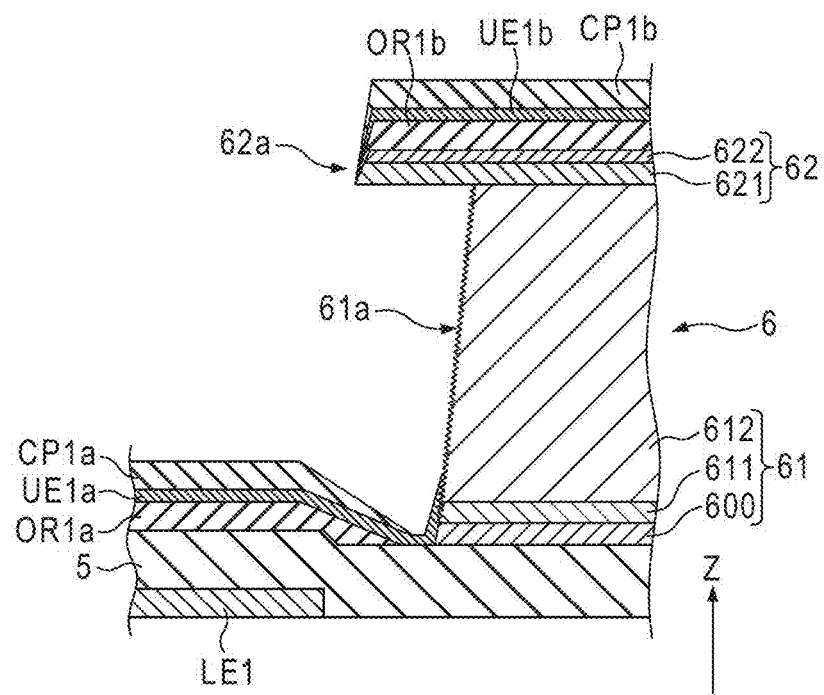
FIG. 5 is a schematic, enlarged cross-sectional view showing a part of the partition.

FIG. 5 is a schematic, enlarged cross-sectional view showing a part of the partition 6. This figure shows the rib 5, the lower electrode LE1, the first organic layer OR1a, the first upper electrode UE1a, the first cap layer CP1a, the second organic layer OR1b, the second upper electrode UE1b, and the second cap layer CP1b, in addition to the partition 6.

As shown in FIG. 5, the side surface 61a of the lower portion 61 slightly uneven. Alternatively, the side surface 61a has a rough surface. This unevenness is formed on, for example, surfaces of the first aluminum layer 611 and the second aluminum layer 612 on the side surface 61a. From the other viewpoint, at least a part of the side surface 61a has greater roughness than an upper surface of the first aluminum layer 611 which is in contact with the second aluminum layer 612, a lower surface of the second aluminum layer 612 which is in contact with this upper surface, an upper surface of the second aluminum layer 612 which is in contact with the first layer 621, a lower surface of the first aluminum layer 611 which is in contact with the barrier layer 600, an upper surface of the barrier layer 600 which is in contact with this lower surface, an upper surface of the rib 5, or the like.

The first upper electrode UE1a is in contact with the area of the side surface 61a which includes unevenness. Thus, area of the contact between the first upper electrode UE1a and the lower portion 61 can be increased and desirable conduction between the lower portion 61 and the first upper electrode UE1a can be secured.

In FIG. 5, the side surface 61a has been focused, but the side surface 61b also has similar unevenness. Furthermore, desirable conduction of the first upper electrodes UE2a and UE3a with the lower portion 61 can also be secured by such unevenness. In FIG. 5, an example in which the side surface 61a is slightly uneven has been described, but the side surface is not limited to this, and the side surfaces 61a and 61b of the lower portion 61 may be smooth surfaces or flat surfaces. In this case, too, desirable conduction can be secured as long as the first upper electrode UE1a is formed by the manufacturing method to be described below.

Next, a method of manufacturing the display device DSP will be described.

Figure 6:
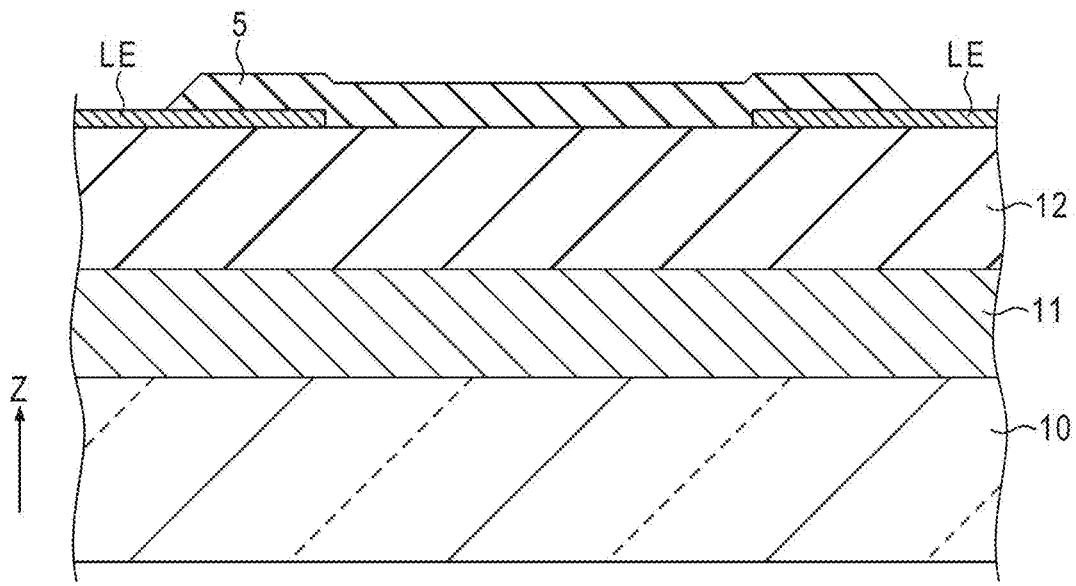
FIG. 6 is a schematic cross-sectional view showing a manufacturing process for forming the partition.

FIG. 6 to FIG. 10 are schematic cross-sectional views mainly showing a process of forming the partition 6, of the method of manufacturing the display device DSP. First, as shown in FIG. 6, the circuit layer 11, the insulating layer 12, the lower electrode LE, and the rib 5 are formed in this order above the substrate 10.

Figure 7:
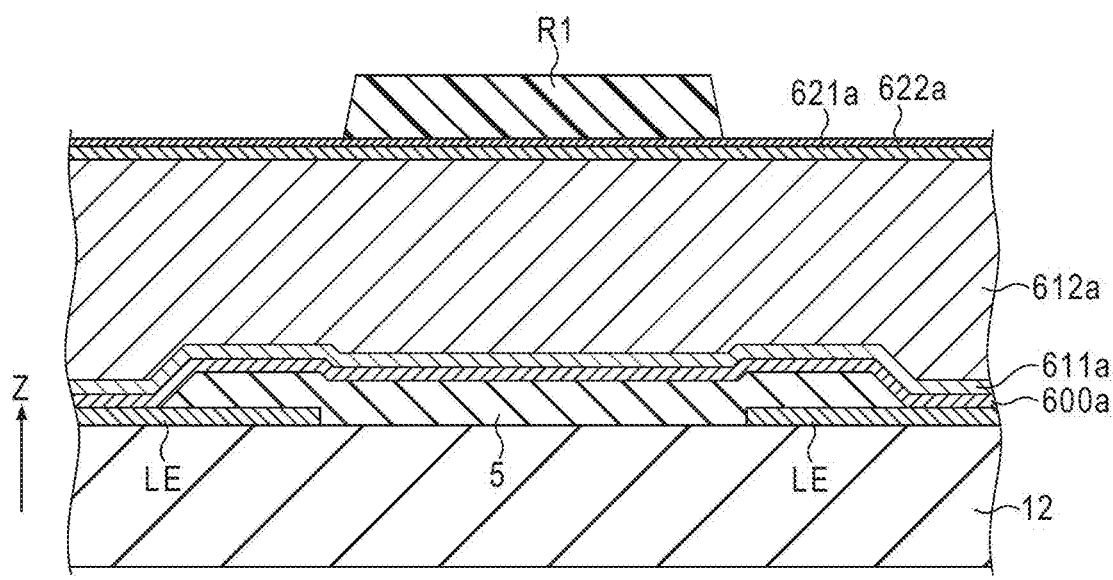
FIG. 7 is a schematic cross-sectional view showing a manufacturing process following FIG. 6.

Next, as shown in FIG. 7, a barrier layer 600a which covers the rib 5 and the lower electrode LE is formed, a first aluminum layer 611a is formed on the barrier layer 600a, a second aluminum layer 612a is formed on the first aluminum layer 611a, a second aluminum layer 612a is formed on the first aluminum layer 611a, a first layer 621a is formed on the second aluminum layer 612a, and a second layer 622a is formed on the first layer 621a. Sputtering can be applied to the formation of the barrier layer 600a, the first aluminum layer 611a, the second aluminum layer 612a, the first layer 621a, and the second layer 622a.

Furthermore, as shown in FIG. 7, a resist R is formed on the second layer 622a. The resist R1 is patterned in the same shape as the partition 6 in planar view.

Figure 8:
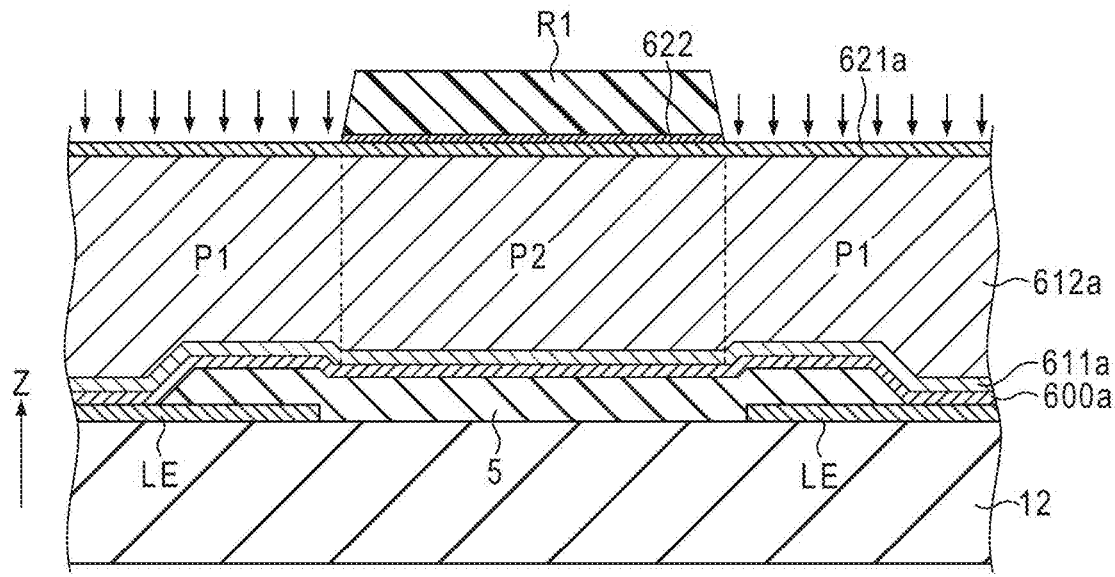
FIG. 8 is a schematic cross-sectional view showing a manufacturing process following FIG. 7.

Next, as shown in FIG. 8, etching is performed using the resist R1 as a mask such that a portion of the second layer 622a which is exposed from the resist R1 is removed. The second layer 622 having the shape shown in FIG. 4 is thereby formed. In the following descriptions, a portion of the second aluminum layer 612a which is exposed from the resist R1 and the second layer 622 (i.e., a portion which does not overlap in the third direction Z) is referred to as a first portion P1. In addition, a portion of the second aluminum layer 612a which is located under the resist R and the second layer 622 is referred to as a second portion P2.

In the embodiment, two types of etching are applied to the first aluminum layer 611a and the second aluminum layer 612a, and the partition 6 having the shape shown in FIG. 4 is formed. More specifically, anisotropic dry etching shown in FIG. 9 and isotropic wet etching shown in FIG. 10 are performed.

Figure 9:
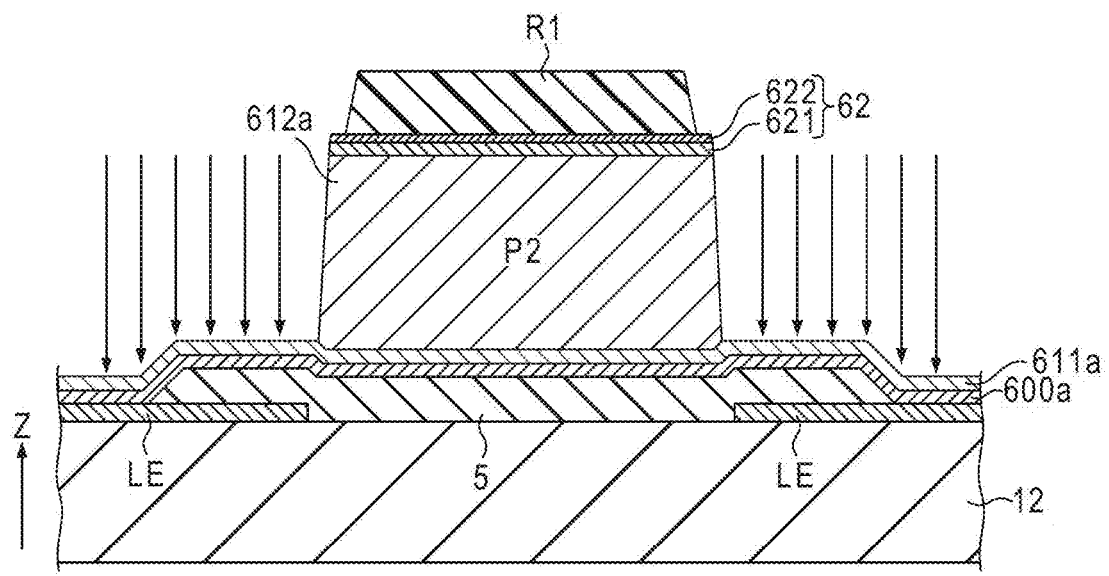
FIG. 9 is a schematic cross-sectional view showing a manufacturing process following FIG. 8.

As shown in FIG. 9, a part of the first layer 621a which is exposed from the resist R and the second layer 622 are removed in the anisotropic dry etching. The upper portion 62 including the first layer 621 and the second layer 622 having the shape shown in FIG. 4 is thereby formed.

Furthermore, the first portion P1 is removed in the anisotropic dry etching. The first aluminum layer 611a has high etching selectivity for the second aluminum layer 612a. In other words, the etching rate of the first aluminum layer 611a in the anisotropic dry etching is slower than that of the second aluminum layer 612a in the anisotropic dry etching. The first aluminum layer 611a thereby functions as an etch stopper in the anisotropic dry etching. The anisotropic dry etching is stopped in a state in which the first aluminum layer 611a is not completely removed.

The width of the resist R1 may be reduced during etching as shown in FIG. 9, depending on the conditions of the anisotropic dry etching. Even in this case, for example, reduction in the width of the second layer 622 can be prevented by forming the second layer 622 of a material such as a conductive oxide that is highly resistant to the anisotropic dry etching.

In the isotropic wet etching, as shown in FIG. 10, the width of the second portion P2 is reduced by removing parts of the second portion P2 which are located under the end portions 62a and 62b of the upper portion 62. Furthermore, parts of the first aluminum layer 611a and the barrier layer 600a which are exposed from the second aluminum layer 612a are removed. As a result, the lower portion 61 including the barrier layer 600, the first aluminum layer 611, and the second aluminum layer 612 having the shape shown in FIG. 4 is formed. The unevenness of the side surface 61a shown in FIG. 5 is formed by, for example, the isotropic wet etching.

The amount of reducing the width of the second portion P2 by the isotropic wet etching can be varied in accordance with the shape obtained for the partition 6. As an example, the width of the second portion P2 is reduced such that the above-described amount of protrusion D is 2.0 μm or less or smaller than the thickness of the lower portion 61, in the isotropic wet etching. In the isotropic wet etching, for example, an etchant containing phosphoric acid, nitric acid, and acetic acid.

After the partition 6 is completed through the processes of FIG. 6 to FIG. 10, the resist R is removed. Furthermore, processes of forming the display element 20 for the sub-pixels SP1, SP2, and SP3 are performed.

Figure 11:
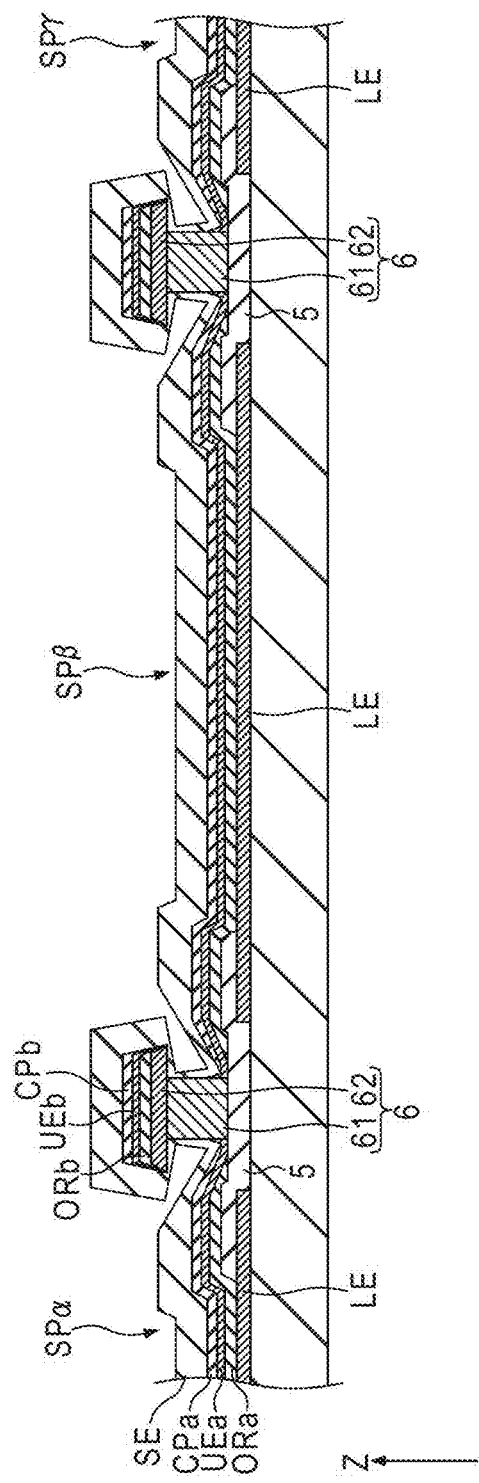
FIG. 11 is a schematic cross-sectional view showing a manufacturing process for forming a display element.
Figure 12:
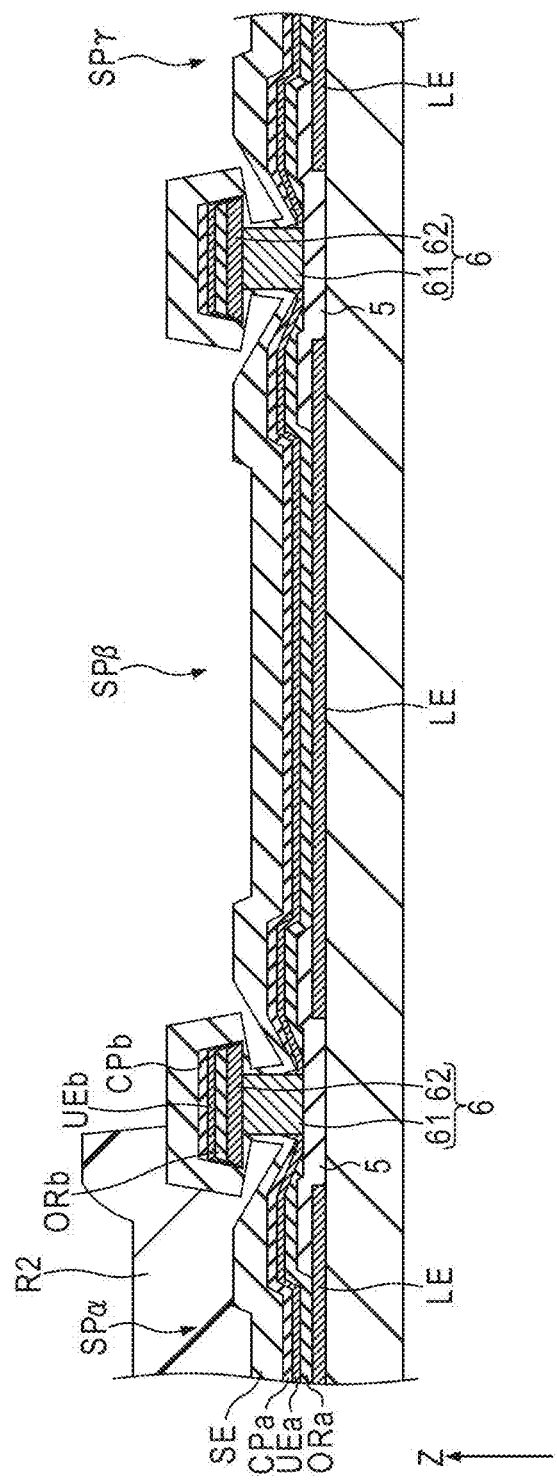
FIG. 12 is a schematic cross-sectional view showing a manufacturing process following FIG. 11.
Figure 13:
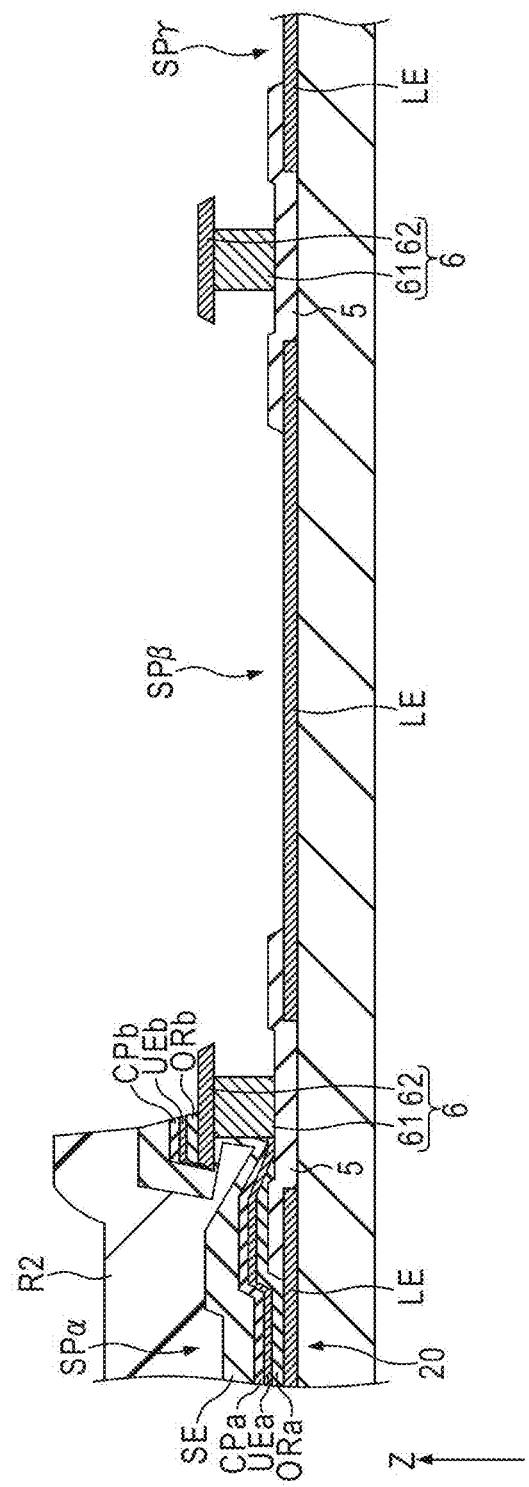
FIG. 13 is a schematic cross-sectional view showing a manufacturing process following FIG. 12.

FIG. 11 to FIG. 13 are schematic cross-sectional views mainly showing the processes of forming the display element 20, of the method of manufacturing the display device DSP. Sub-pixels SPα, SPβ, and SPγ shown in these figures correspond to any of the sub-pixels SP1, SP2, and SP3.

After the partition wall 6 is formed as described above, the organic layer OR, the upper electrode UE, the cap layer CP, and the sealing layer SE are formed in this order on the entire substrate by vapor deposition as shown in FIG. 11. The organic layer OR includes an emitting layer that emits light of a color corresponding to the sub-pixel SPα. By the overhanging partition 6, the organic layer OR is divided into a first organic layer ORa covering the lower electrode LE and a second organic layer ORb on the partition 6, the upper electrode UE is divided into a first upper electrode UEa covering the first organic layer ORa and a second upper electrode UEb covering the second organic layer ORb, and the cap layer CP is divided into a first cap layer CPa covering the first upper electrode UEa and a second cap layer CPb covering the second upper electrode UEb. The first upper electrode UEa is in contact with the lower portion 61 of the partition 6. The sealing layer SE continuously covers the first cap layer CPa, the second cap layer CPb, and the partition 6.

Next, a resist R2 is formed on the sealing layer SE as shown in FIG. 12. The resist R2 covers the sub-pixel SPα. In other words, the resist R2 is arranged just above the first organic layer ORa, the first upper electrode UEa, and the first cap layer CPa that are located in the sub-pixel SPα. The resist R2 is also located just above a portion close to the sub-pixels SPα, of the second organic layer ORb, the second upper electrode UEb, and the second cap layer CPb on the partition 6 between the sub-pixels SPα and SPβ.

Furthermore, as shown in FIG. 13, portions of the organic layer OR, the upper electrode UE, the cap layer CP, and the sealing layer SE, which are exposed from the resist R2, are removed by the etching using the resist R2 as a mask. As a result, the display element 20 including the lower electrode LE, the first organic layer ORa, the first upper electrode UEa, and the first cap layer CPa is formed in the sub-pixel SPα. In contrast, the lower electrode LE is exposed in the sub-pixels SPβ and SPγ. The etching is, for example, dry etching using an etching gas such as CF4 or CF6.

After that, the resist R2 is removed and the processes of forming the display elements 20 of the sub-pixels SPβ and SPγ are performed sequentially. These processes are the same as those described above for the sub-pixel SPα.

The display device DSP shown in FIG. 3 is completed by forming the display elements 20 of the sub-pixels SP1, SP2, and SP3 by the processes exemplified for the above-described sub-pixels SPα, SPβ, and SPγ and further forming the resin layer 13, the sealing layer 14, and the resin layer 15.

To improve the reliability of the display device DSP, it is necessary to form the desirable overhanging partition 6 and form the display elements 20. In general, it is not easy to form the overhanging bulkhead 6 uniformly and reproducibly over the entire display device DSP. For example, in a case where the entire lower portion 61 of the partition 6 is formed of pure aluminum, if the upper portion 62 of the partition 6 and the resist are formed on the aluminum layer formed on the entire substrate and are subjected to wet etching, the portion of the aluminum layer which is exposed from the resist can be removed, and the width of the portion of the aluminum layer which is located under the resist can be reduced and the overhanging partition 6 can be obtained. However, when the partition 6 is thus formed only by wet etching, large irregularity may easily occur at the width of the lower portion due to influence from non-uniformity of the direction of flow of the etchant and the flow rate. In addition, the width of the lower portion 61 is largely reduced, and the structure in which, for example, the amount of protrusion D is smaller than or equal to the thickness of the lower portion 61 can hardly be implemented.

In contrast, when the anisotropic dry etching is first performed to remove the aluminum layer (second aluminum layer 612) exposed from the resist R1 and reduce the width of the aluminum layer by the subsequent isotropic wet etching, irregularity in the width of the lower portion 61 can be suppressed over the entire substrate.

Furthermore, in the embodiment, the lower portion 61 includes the first aluminum layer 611 and the second aluminum layer 612. Since both the first aluminum layer 611 and the second aluminum layer 612 contain aluminum as the main component but are formed of different materials, the layers exhibit selectivity for the anisotropic dry etching. Thus, it is possible to make the first aluminum layer 611 function as an etching stopper and to prevent each layer under the first aluminum layer 611 from being exposed in the anisotropic dry etching. For example, if the barrier layer 600 formed of molybdenum is exposed in the anisotropic dry etching, contamination caused by molybdenum may occur in the chamber of the etching device. In the embodiment, since the barrier layer 600 is not exposed in the anisotropic dry etching, the occurrence of such contamination can be suppressed.

Even if, for example, the entire lower portion of the partition is formed of pure aluminum, the barrier layer 600 and the like can be protected from the anisotropic dry etching by not completely removing the portion of the aluminum layer formed over the entire substrate, which is exposed from the resist, but partially leaving the portion and stopping the anisotropic dry etching. In this case, however, it is difficult to precisely control the timing of stopping the anisotropic dry etching, and at least 30% of the original thickness of the aluminum layer needs to be left for practical use. For this reason, it is difficult to precisely control the amount of the aluminum layer removed in the subsequent isotropic wet etching.

In contrast, when the first aluminum layer 611 is used as an etching stopper in the anisotropic dry etching similarly to the embodiment, it is easy to control the timing of stopping the etching, and the thickness of the aluminum layer to be left in the etching (i.e., the thickness of the first aluminum layer 611) can be reduced to, for example, 30% or less. Thus, the amount of the second aluminum layer 612 that is removed in the subsequent isotropic wet etching can be controlled accurately.

According to the embodiment, the display device DSP excellent in reliability and its manufacturing method can be provided by various advantages exemplified here.

All of display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, the above embodiments with addition, deletion, and/or designed change of their structural elements by a person having ordinary skill in the art, or the above embodiments with addition, omission, and/or condition change of their processes by a person having ordinary skill in the art are encompassed by the scope of the present inventions without departing the spirit of the inventions.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
   a lower electrode;
   a rib which covers a part of the lower electrode and which includes an aperture overlaps with the lower electrode;
   a partition arranged on the rib;
   an upper electrode which is opposed to the lower electrode and is in contact with the partition;
   an organic layer located between the lower electrode and the upper electrode to emit light in accordance with a potential difference between the lower electrode and the upper electrode; and
   a sealing layer located above the upper electrode,
   wherein
   the partition includes a lower portion arranged on the rib, and an upper portion arranged on the lower portion with an end portion protruding from a side surface of the lower portion,
   the lower portion includes a first aluminum layer formed of a first aluminum alloy, and a second aluminum layer which is formed of pure aluminum or a second aluminum alloy different from the first aluminum alloy and which is arranged on the first aluminum layer.

2. The display device of claim 1, wherein
   the first aluminum alloy is an aluminum-neodymium alloy or an aluminum-yttrium alloy.

3. The display device of claim 1, wherein
   the second aluminum alloy is an aluminum-silicon alloy.

4. The display device of claim 1, wherein
a thickness of the first aluminum layer is 30% or less of a total thickness of the first aluminum layer and the second aluminum layer.

5. The display device of claim 1, wherein
the lower portion further comprises a barrier layer located between the rib and the first aluminum layer.

6. The display device of claim 5, wherein
the barrier layer is formed of any one of molybdenum, a molybdenum tungsten alloy, and copper.

7. The display device of claim 1, wherein
the upper portion includes at least one of a conductive oxide and titanium.

8. The display device of claim 7, wherein
the upper portion includes a first layer formed of titanium and a second layer formed of a conductive oxide.

9. The display device of claim 8, wherein
the second layer covers the first layer.

10. The display device of claim 1, wherein
a side surface of the lower portion is uneven.

11. A method of manufacturing a display device in which a partition including a lower portion and an upper portion arranged on the lower portion with an end portion protruding from a side surface of the lower portion is arranged on a boundary between adjacent sub-pixels, the method comprising:
    forming a first aluminum layer of a first aluminum alloy;
    forming a second aluminum layer of pure aluminum or a second aluminum alloy different from the first aluminum alloy, on the first aluminum layer;
    forming the upper portion on the second aluminum layer;
    removing a portion of the second aluminum layer, which is exposed from the upper portion, by anisotropic etching; and
    reducing a width of the second aluminum layer located under the upper portion and removing a portion of the first aluminum layer, which is exposed from the second aluminum layer, by isotropic etching, and thereby forming the lower portion.

12. The method of claim 11, wherein
an etching rate of the first aluminum layer in the anisotropic etching is slower than an etching rate of the second aluminum layer in the anisotropic etching.

13. The method of claim 11, wherein
the first aluminum alloy is an aluminum-neodymium alloy or an aluminum-yttrium alloy.

14. The method of claim 11, wherein
the second aluminum alloy is an aluminum-silicon alloy.

15. The method of claim 11, wherein
a thickness of the first aluminum layer is 30% or less of a total thickness of the first aluminum layer and the second aluminum layer.

* * * * *